United States Patent
Chu et al.

(10) Patent No.: US 10,482,960 B2
(45) Date of Patent: Nov. 19, 2019

(54) DUAL DEMARCATION VOLTAGE SENSING BEFORE WRITES

(71) Applicant: Intel Corporation, Santa Clara, CA (US)

(72) Inventors: Daniel Chu, Folsom, CA (US); Kiran Pangal, Fremont, CA (US); Mase Taub, Folsom, CA (US); Sandeep Guliani, Folsom, CA (US); Raymond Zeng, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/046,339

(22) Filed: Feb. 17, 2016

(65) Prior Publication Data

US 2017/0236580 A1   Aug. 17, 2017

(51) Int. Cl.
*G11C 13/00* (2006.01)

(52) U.S. Cl.
CPC ........ *G11C 13/0069* (2013.01); *G11C 13/004* (2013.01); *G11C 13/0004* (2013.01); *G11C 13/0028* (2013.01); *G11C 13/0064* (2013.01); *G11C 13/0097* (2013.01); *G11C 2013/0054* (2013.01); *G11C 2013/0076* (2013.01); *G11C 2207/2263* (2013.01)

(58) Field of Classification Search
CPC ............ G11C 13/0004; G11C 13/0064; G11C 13/0069; G11C 2013/0076
See application file for complete search history.

(56) References Cited

U.S. PATENT DOCUMENTS

| | | | | |
|---|---|---|---|---|
| 7,522,449 B2* | 4/2009 | Ro | ...... | G11C 11/5678 365/148 |
| 7,529,124 B2* | 5/2009 | Cho | ...... | G11C 8/10 365/158 |
| 7,983,077 B2* | 7/2011 | Park | ...... | G11C 11/5678 365/148 |
| 7,995,381 B2* | 8/2011 | Nirschl | ...... | G11C 13/0004 365/148 |
| 8,134,866 B2* | 3/2012 | Bae | ...... | G11C 5/143 365/163 |
| 8,605,495 B2* | 12/2013 | Lung | ...... | H01L 45/06 365/163 |
| 2004/0022085 A1 | 2/2004 | Parkinson et al. | | |
| 2007/0236987 A1 | 10/2007 | Cho et al. | | |
| 2008/0165572 A1 | 7/2008 | Lung | | |
| 2011/0261616 A1 | 10/2011 | Kim | | |
| 2016/0247562 A1* | 8/2016 | Tortorelli | ...... | G11C 13/004 |

OTHER PUBLICATIONS

European Office Action for Patent Application No. 17702478.3, dated Sep. 25, 2019, 6 pages.

* cited by examiner

*Primary Examiner* — Vanthu T Nguyen
(74) *Attorney, Agent, or Firm* — Thorpe North and Western, LLP; David W. Osborne

(57) ABSTRACT

Nonvolatile memory (e.g. phase change memory) devices, systems, and methods of programming the nonvolatile memory including sensing of a snapback current using a set demarcation voltage for set bit mapped cells and a reset demarcation voltage for reset bit mapped cells before selective writes.

14 Claims, 4 Drawing Sheets

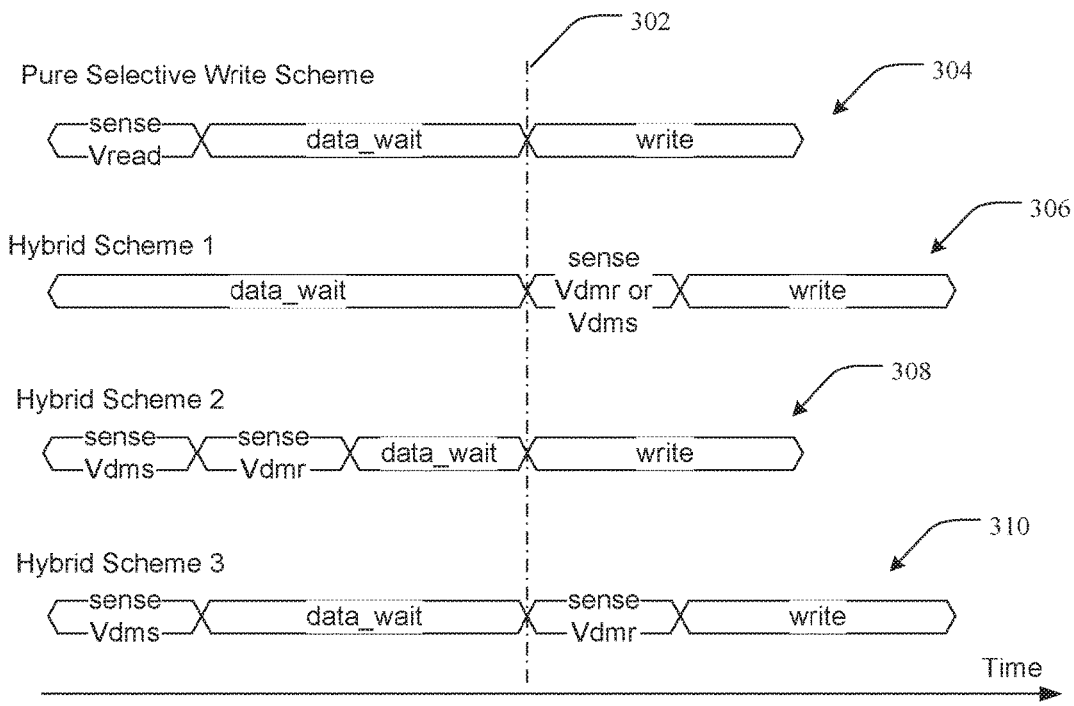
FIG. 3
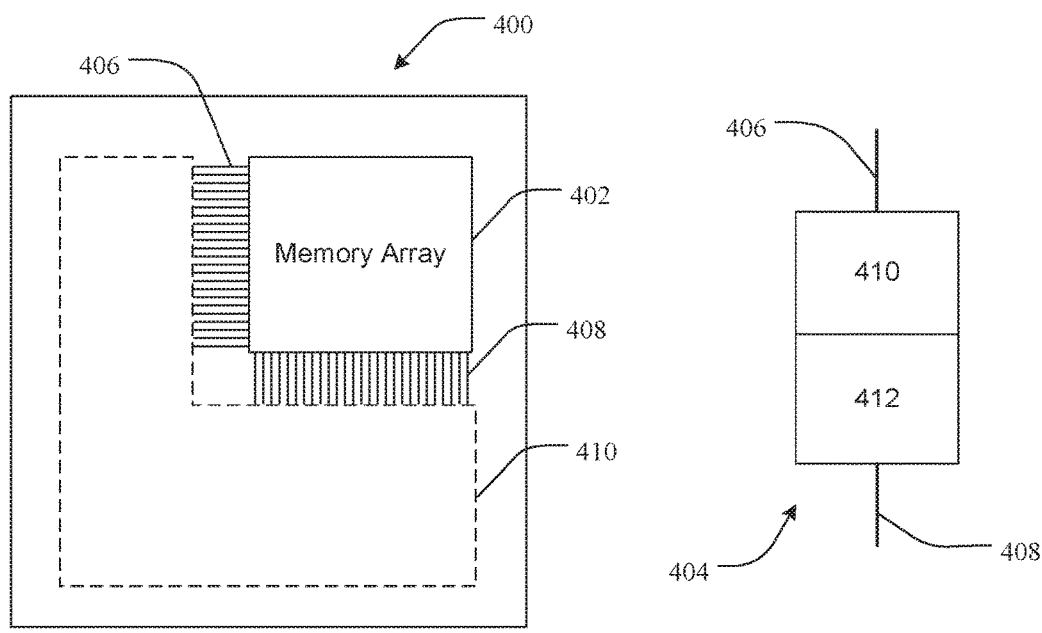
FIG. 4a                    FIG. 4b

DUAL DEMARCATION VOLTAGE SENSING BEFORE WRITES

BACKGROUND

Phase change materials can be used in a number of applications such as ovonic threshold switches and phase change memory (PCM). Different physical states of the phase change material have different levels of electrical resistance. For example, one state, such as an amorphous state, can have a high electrical resistance, while another state, such as a crystalline state, can have a low electrical resistance. In PCM, these different levels of electrical resistance can be used to store information. Each state is designated a different value, and once stored, information can be read by detecting the electrical resistance of the material. The fact that each state persists once fixed makes PCM a valuable non-volatile memory (NVM) type.

BRIEF DESCRIPTION OF THE DRAWINGS

FIG. 3 is a schematic view of various algorithm timing diagrams;
FIG. 4a is a schematic view of a phase change memory device;
FIG. 4b is a schematic view of a phase change memory cell.

DESCRIPTION OF EMBODIMENTS

Figure 1:
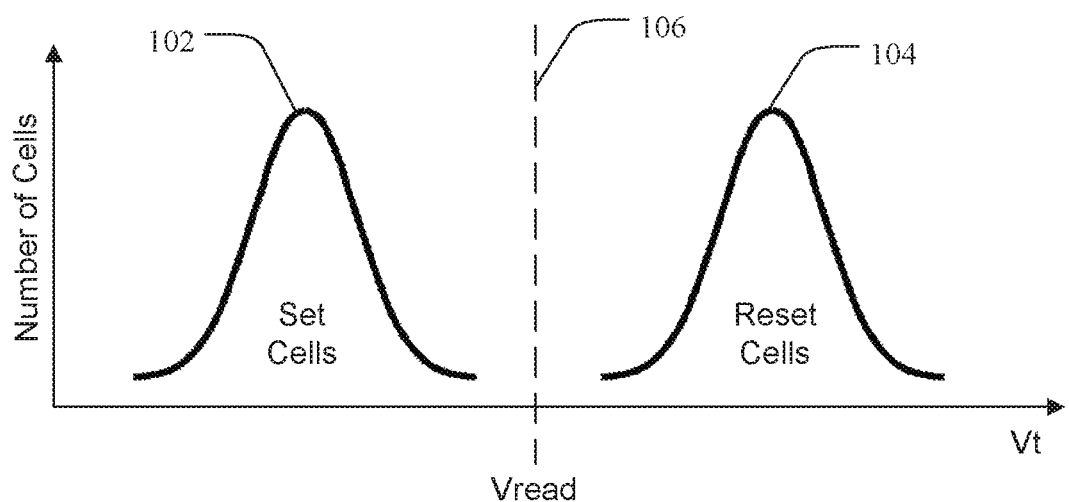
FIG. 1 is a graphical representation of model data.

Although the following detailed description contains many specifics for the purpose of illustration, a person of ordinary skill in the art will appreciate that many variations and alterations to the following details can be made and are considered to be included herein.

Accordingly, the following embodiments are set forth without any loss of generality to, and without imposing limitations upon, any claims set forth. It is also to be understood that the terminology used herein is for describing particular embodiments only, and is not intended to be limiting. Unless defined otherwise, all technical and scientific terms used herein have the same meaning as commonly understood by one of ordinary skill in the art to which this disclosure belongs.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term in this specification, like "comprising" or "including," it is understood that direct support should be afforded also to "consisting essentially of" language as well as "consisting of" language as if stated explicitly and vice versa.

"The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

As used herein, "enhanced," "improved," "performance-enhanced," "upgraded," and the like, when used in connection with the description of a device or process, refers to a characteristic of the device or process that provides measurably better form or function as compared to previously known devices or processes. This applies to both the form and function of individual components in a device or process, as well as to such devices or processes as a whole.

As used herein, "coupled" refers to a relationship of physical connection or attachment between one item and another item, and includes relationships of either direct or indirect connection or attachment. Any number of items can be coupled, such as materials, components, structures, layers, devices, objects, etc.

As used herein, "directly coupled" refers to a relationship of physical connection or attachment between one item and another item where the items have at least one point of direct physical contact or otherwise touch one another. For example, when one layer of material is deposited on or against another layer of material, the layers can be said to be directly coupled.

Objects or structures described herein as being "adjacent to" each other may be in physical contact with each other, in close proximity to each other, or in the same general region or area as each other, as appropriate for the context in which the phrase is used.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Example Embodiments

An initial overview of technology embodiments is provided below and specific technology embodiments are then described in further detail. This initial summary is intended to aid readers in understanding the technology more quickly, but is not intended to identify key or essential technological features, nor is it intended to limit the scope of the claimed subject matter.

Phase change memory (PCM) is a type of non-volatile random-access memory whereby a detectable change in the physical state of a material is used as the basis for an information storage medium. For example, phase change chalcogenide materials have at least two relatively stable states or phases having a large electrical resistance disparity between the two. The amorphous state tends to have a high electrical resistance, while the crystalline state tends to have a lower electrical resistance. Such material properties can be manipulated and used as the basis for a non-volatile memory storage medium. For example, a phase change material in the lower-resistance crystalline state can represent a first binary state, while a phase change material in the higher-resistance amorphous state can represent a second binary state. A binary storage device can thus be realized by inducing the material into either state to correspond with the information or data being stored, and then retrieved by reading the electrical resistances across the material to determine the resistive states of each memory bit. As a simplified example, the material can be heated and cooled in a manner that causes the material to solidify into either the crystalline state or the amorphous state. Furthermore, it may be possible to solidify the material into one of a multitude of other electrically resistive states along the spectrum between fully amorphous and fully crystalline, thus potentially providing a mechanism for the storage of multiple memory states in a single bit.

Due to the relative stability of the phase change material, the programmed state is retained independent of an applied voltage. As such, information stored as a binary representation of phase states in a device utilizing such materials is retained when powered is not supplied. Similarly, the state of a phase change material used in other applications will be maintained once power has been removed from the device.

The use of phase change materials in devices such as PCM cells, selectors, switches, and the like, is made possible by controlling the voltage across and the current through the cell. A typical phase change material in an amorphous state has a higher threshold voltage (Vt) than when it is in a crystalline state. The Vt represents a threshold at which a phase change material experiences a switch in electrical conductivity from a high resistance to a low resistance state. A PCM cell's state can be determined by applying a voltage across it and sensing if the cell is conductive or not. If the applied voltage is less than the Vt, the cell will not conduct. If the applied voltage exceeds the Vt, the cell will conduct. If the current is kept low, the conductivity of the cell can be sensed without affecting the cell's state. If the current is increased, however, the PCM cell can be heated to its melting point, and, under such conditions, the state of the cell can be changed. If the current is abruptly switched off after melting, the material will return to the amorphous state, and the Vt will be high for later operations. If the material is heated to a temperature between the crystallization temperature (or glass transition temperature) and the melting point temperature for that material, and then maintained at the temperature (or within this range) for a sufficient time, the phase change material will crystallize and subsequently cool into the conductive state.

This threshold switching transition from the low-voltage/high-resistive state to the high-voltage/low-resistive state can occur very rapidly, on the order of a few picoseconds, for example. The voltage change across the device, however, is much slower, on the order of a few nanoseconds, for example. A transient current (i.e. snap back current) can flow into the device as a result of this potential difference, which can be utilized to determine the state of a given PCM cell or other device or material having phase change properties. FIG. 1, for example, shows a graph of a distribution of set cells 102 and a distribution of reset cells 104 along a Vt axis. The state of a given PCM cell can be determined by applying a read bias (Vread) 106 across the cell. If a snap back current is generated (i.e. the PCM cell "snaps"), then Vread is above Vt, indicating that the PCM cell is in the set cell distribution 102 and thus is in a crystalline state. If a snap back current is not generated, then Vread is below Vt, indicating that the PCM cell is in the reset cell distribution 104, and thus is in an amorphous state.

In order to perform a write operation, a current pulse is sent to the PCM cell, such as a "set pulse" to write the PCM cell to a set state or a "reset pulse" to write the PCM cell to a reset state. Thus the set pulse and the reset pulse have voltage, current, and timing characteristics such that the phase change material of the PCM cell melts and then cools into the proper state, as described above. Accordingly, in response to a request to write data at a given memory location, set pulses and reset pulses corresponding to each bit value of the data are sent to individual PCM cells at corresponding memory locations.

One technique for accomplishing such a write operation can be referred to as a "force write," in which every bit of the data is written to the memory location regardless of the prior state of the PCM cells. The energy-per-bit is high for such a technique since even those cells in the memory location that match the bit value of the incoming data are rewritten. Additionally, wear on the PCM cells is high and reduces the lifetime of the device. Thus, while a force write protocol gives good error rate reduction, it can be high in energy use and memory cell wear because every bit is written to on every write event.

Another technique for accomplishing a write operation can be referred to as a "selective write," in which only bits that change the state of PCM cells within the memory location are written to. In one example, a pre-read of PCM cells in the memory location can be performed to determine the pre-write data values, which can be used to determine if a given bit should be written to or not. Thus, a pre-read pulse having a demarcation voltage (Vdm) at or near Vread can determine the present state of each PCM cell in the memory array, and allow write pulses to be applied only to those PCM cells that need a state change. With random data, for example, only about 50% of the bits would be written to on average, with about 50% of the bits left untouched. This results in an energy-per-bit cost that is about half of a force write and could provide an improvement in endurance by at least a factor of 2×.

One problem with a purely selective write, however, is the accumulation of marginal errors. If a PCM cell's Vt is near the read or pre-read Vdm, the pre-read operation may determine that the bit is already in the needed state when it may not be. The bit will be inhibited from writing and thus be maintained in an ambiguous state. Such "marginal" bits could later read as errors. In response to a disturb or Vt drift mechanism, marginal bits can change from a marginally-good state (Vt close to Vdm but read correctly) to an error state.

Figure 2:
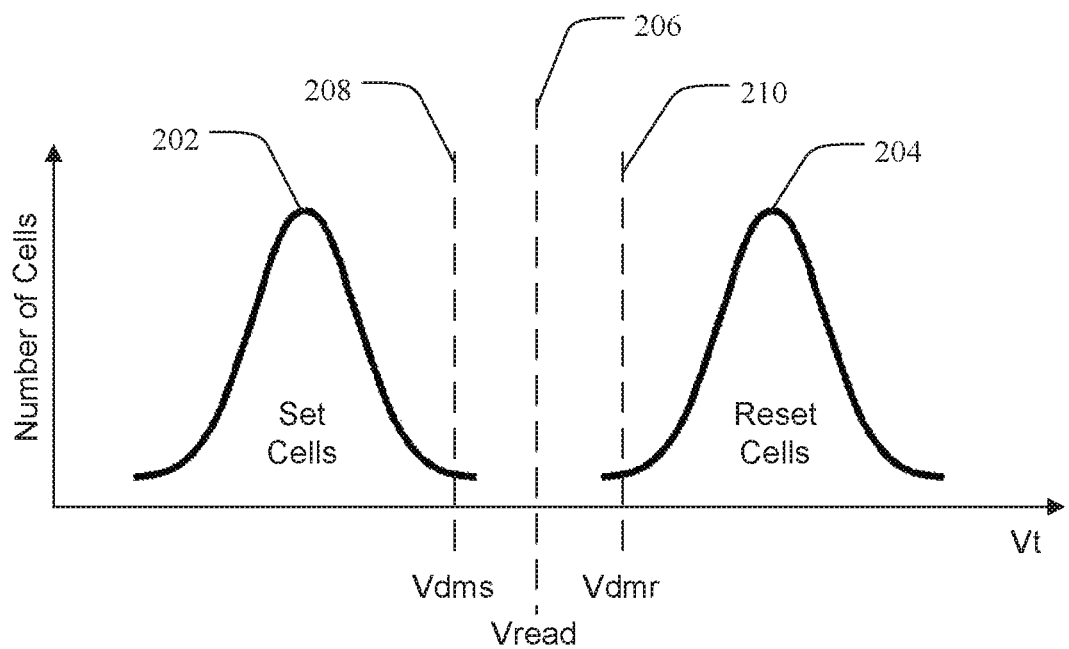
FIG. 2 is a graphical representation of model data.

In some embodiments, memory devices, systems, and methods are described that control or reduce energy expenditure and wear similar to selective write, but have a greatly improved error rate with respect to marginal bits. Controlling memory in such ways provides a number of advantages, and can be accomplished in one embodiment, using a pre-read comprising multiple Vdm signals. For a dual Vdm pre-read technique, for example, pre-existing data can be sensed at two different Vdms, as opposed to a single Vdm at or near Vread. FIG. 2 shows a graph of a distribution of set cells 202 and a distribution of reset cells 204 along a Vt axis. Vread 206 represents the voltage at which PCM cells will be read, as has been described. If the data bit to be written is a set bit, a set Vdm (Vdms) 208 having a voltage below Vread can be applied to the corresponding PCM cell to determine the current data bit status. If the PCM cell snaps, then the Vt of that cell is below Vdms, indicating that the data bit of the cell is currently a set bit. In this case, write commands to the PCM cell can be inhibited because the pre-existing data matches the data to be written. On the other hand, if the PCM cell does not snap, then the Vt of the cell is above Vdms, indicating that the data bit of the cell is currently either a reset bit, or a set bit that is in the range of voltages between Vdms and Vread. In this case, the incoming data will be written to the PCM cell to either write a previous reset cell as a set cell, or to "refresh" a set cell. If the previously set cell had a Vt that had drifted or disturbed toward Vread, a set pulse write will likely bring it back toward the center of the set cell distribution. If the data bit to be written is a reset bit, a reset Vdm (Vdmr) 210 having a voltage above Vread can be applied to the corresponding PCM cell to determine the current data bit status. If the PCM cell does not snap, then the Vt of that cell is above Vdmr, indicating that the data bit of the cell is currently a reset bit. In this case, write commands to the PCM cell can be inhibited because the pre-existing data matches the data to be written. On the other hand, if the PCM cell snaps, then the Vt of the cell is below Vdmr, indicating that the data bit of the cell is currently either a set bit, or a reset bit that is in the range of voltages between Vdmr and Vread. In this case, the incoming data will be written to the PCM cell to either write a previous set cell as a reset cell, or to "refresh" a reset cell. If the previous reset cell had a Vt that had drifted or disturbed toward Vread, a reset pulse write will likely bring it back toward the center of the reset cell distribution.

By utilizing a Vdms and a Vdmr that are offset from Vread as opposed to a single Vdm at or near Vread, PCM cells that may be prone to marginal errors near Vread are rewritten regardless of the bit status of the cell. In this manner, PCM cells having a Vt between Vdms 208 and Vdmr 210 are automatically written over by the incoming data in a force write to return the cells toward either the normal set or reset distributions, while PCM cells having a Vt outside of this intermediate range are selectively rewritten depending on the current data bit status of each cell. Rewriting bits that are in the marginal Vt zone near Vread thus decreases the error rate of subsequent reads, and selectively rewriting bits outside of the marginal zone reduces energy-per-bit cost and overall memory cell wear. While there is some energy-per-bit increase compared to a purely selective write scheme due to the additional rewritten bits, the force write zone (or margin zone) can be kept small to reduce such increase.

The voltages used for Vdms and Vdmr can vary depending on a variety of factors, such as system design, PCM device design, PCM material characteristics, intended use, design choice, and the like. As described above, there is a tradeoff between energy usage/PCM wear and marginal error rate. The voltage values of Vdmr and Vdms establish boundaries for the reset and set distributions, and can be adjusted to, for example, balance this tradeoff. Thus, Vdms represents the highest set Vt that a set PCM cell can have; writing a set data bit to a cell having a Vt above Vdms will result in a force write. Similarly, Vdmr represents the lowest Vt that a reset PCM cell can have; writing a reset data bit to a cell having a Vt below Vdmr will result in a force write. Thus, the Vt voltage values of Vdmr and Vdms can be set empirically or non-empirically in order to achieve a desired result.

Table 1 shows one example of a write pulse/inhibit logic table for a purely selective write scheme, and Table 2 shows one example of a write pulse/inhibit logic table for utilizing dual demarcation voltages in a hybrid selective write/force write scheme. If the data to be written is 0 (reset), for example, then the preexisting data is compared to Vdmr. If the Vt is below Vdmr, the PCM cell will receive a reset pulse. For Vt values that are below Vdmr and above Vread, the purely selective write scheme treats PCM cells as valid reset-programmed cells. If, on the other hand, the data to be written is 1 (set), for example, then the preexisting data is compared to Vdms. If the Vt is above Vdms, the PCM cell will receive a set pulse. For Vt values that are above Vdms but below Vread, the purely selective write scheme treats PCM cells as valid set-programmed cells.

TABLE 1

Purely Selective Write Scheme

| Preexisting Data Bit State | | Data Bit to | |
|---|---|---|---|
| Vt | Vt < Vread | be Written | Action |
| Set | Y | 0 | Reset pulse |
| Reset | N | 0 | No Action |
| Set | Y | 1 | No Action |
| Reset | N | 1 | Set pulse |

TABLE 2

Hybrid Selective Write/Force Write Scheme.

| Preexisting Data Bit State | | | Data Bit to | |
|---|---|---|---|---|
| Vt | Vt < Vdms | Vt < Vdmr | be Written | Action |
| Set | | Y | 0 | Reset pulse |
| In Between | | Y | 0 | Reset pulse |
| Reset | | N | 0 | No Action |
| Set | Y | | 1 | No Action |
| In Between | N | | 1 | Set pulse |
| Reset | N | | 1 | Set pulse |

FIG. 3 shows various non-limiting embodiments of algorithms for processing various write schemes, which are expressed as operation periods along a time axis. Line 302 represents a point in time where all incoming data for the write has been received and is available to the algorithm. In the purely selective write scheme 304, for example, the algorithm will sense for snapback responses to Vread before receiving the data, and will use Table 1, for example, for write pulse/inhibit logic. Write commands to PCM cells having preexisting set data are inhibited for incoming set bits, write commands to PCM cells having preexisting reset data are inhibited for incoming reset bits, and the remaining write data is written to the selected memory location.

As another example, hybrid scheme 1 306 waits for the write data to become available, and then the algorithm senses at either Vdms (if the data is 1) or Vdmr (if the data is 0. This scheme has the advantage of only sensing once per bit, but can, in some cases, take longer to complete than other algorithms because it cannot sense before new data is available.

In yet another example, hybrid scheme 2 308 performs two sense operations, one at Vdms and one at Vdmr, prior to receiving the write data. The algorithm can use Table 3, for example, for write pulse/inhibit logic. Before writing, logic Table 3 can then be applied using only the sense at Vdms for data bits to be set, and only the sense at Vdmr for data bits to be reset. Hybrid scheme 2 can be faster than hybrid scheme 1 because the algorithm doesn't need to wait for all of the incoming data to become available before performing sensing operations on the memory array.

TABLE 3

Hybrid Selective Write/Force Write Scheme.

| Preexisting Data Bit State | | | Data Bit to | |
|---|---|---|---|---|
| Vt | Vt < Vdms | Vt < Vdmr | be Written | Action |
| Set | Y | Y | 0 | Reset pulse |
| In Between | N | Y | 0 | Reset pulse |
| Reset | N | N | 0 | No Action |
| Set | Y | Y | 1 | No Action |
| In Between | N | Y | 1 | Set pulse |
| Reset | N | N | 1 | Set pulse |

In yet another example, hybrid scheme 3 310 performs one sense operation before receiving the write data, and performs the other sense operation after receiving the write data. One benefit to such a scheme is not waiting for all of the write data to be received, assuming that receiving the write data takes more time than one sense operation and less than two sense operations. There may be efficiency or other benefits to one hybrid scheme over another, and it is understood that various schemes and/or algorithms can be used depending on the desired result. As one example of efficiency differences between hybrid scheme 3 and hybrid scheme 1, the sense operation time for hybrid scheme 3 at Vdmr can be reduced by leaving the word line (WL) and the bit line (BL) selected after the sense at Vdms. If the sense operation at Vdms is left with the BL and WL activated, the sense operation at Vdmr does not need to spend time ramping the WL, and the BL ramp may be shorter than engaging from a completely off level. One potential tradeoff, however, is that hybrid scheme 3 can take longer than hybrid scheme 2, as the algorithm does two sense operations, and may expend energy leaving a cell on between the sensing of Vdms and Vdmr.

In one example embodiment, a phase change memory device is provided. As is shown in FIGS. 4a-b for example, a PCM memory device 400 can comprise a memory array 402 that is further comprised of an array of PCM cells 404 coupled together by an array of WLs 406 and an array of BLs 408. As is shown in FIG. 4b, one example of a PCM cell comprises a select device (SD) 410 and a phase change material (PM) 412 coupled to the SD, where the PM has a program state. In one embodiment, the program state can be either crystalline (set) or amorphous (reset), although intermediate program states are contemplated. Additionally, while a WL 406 is shown coupled to the SD 410 and a BL 408 is shown coupled to the PM 412, in some embodiments this coupling arrangement can be switched.

Figure 5:
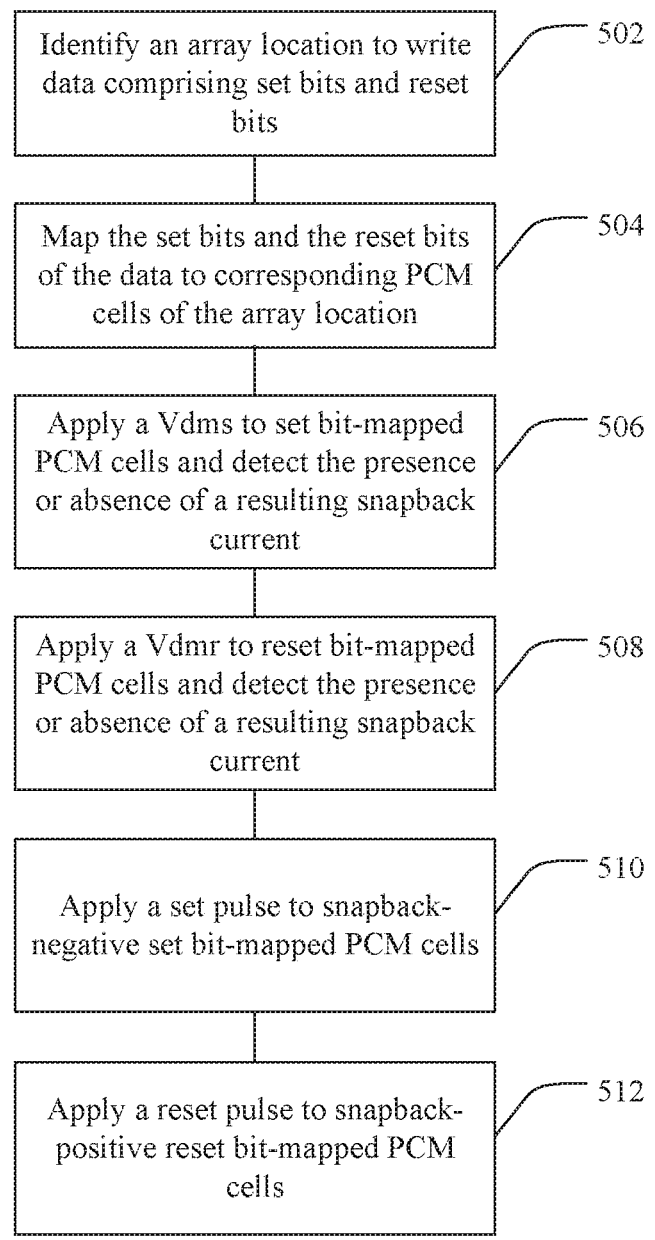
FIG. 5 is a graphical representation of circuitry processes.

The PCM memory device 400 also comprises circuitry 414 coupled to the array of PCM cells, which is generally represented by the dashed box. The circuitry 414 is generally configured, as is shown in FIG. 5, to 502 identify an array location to write data comprising set bits and reset bits, 504 map the set bits and the reset bits of the data to corresponding PCM cells of the array location, 506 apply a Vdms to set bit-mapped PCM cells and detect the presence or absence of a resulting snapback current, 508 apply a Vdmr to reset bit-mapped PCM cells and detect the presence or absence of a resulting snapback current, 510 apply a set pulse to snapback-negative set bit-mapped PCM cells, and 512 apply a reset pulse to snapback-positive reset bit-mapped PCM cells. A snapback-positive PCM cell refers to a PCM cell that generated a snapback current in response to the application of either Vdms or Vdmr, while a snapback-negative PCM cell refers to a PCM cell that did not generate a snapback current. Various circuit designs can be utilized in this way, and any such circuit design is considered to be within the present scope.

As such, the circuitry applies set pulses and reset pulses to PCM cells that are not in the data bit state matching the incoming data, which has been determined by whether or not the PCM cell snaps back in response to the relevant Vdm sensing operation. Inhibition can also be used in the writing process. In one embodiment, for example, the circuitry is further configured to inhibit applying the set pulse to snapback-positive set bit-mapped PCM cells, and to inhibit applying the reset pulse to snapback-negative reset bit-mapped PCM cells. A PCM cell that generates a snapback current in response to Vdms is considered to be in the set state, and therefore set write commands to that cell can be inhibited to avoid unnecessarily write operations. Similarly, a PCM cell that does not generate a snapback current in response to Vdmr is considered to be in the reset state, and therefore reset write commands to that cell can be inhibited to avoid unnecessarily write operations. As a result, in some cases the inhibited PCM cells can be masked and the remaining write data can be written to the selected memory location.

As is shown in FIG. 3, various timing schemes are contemplated, and any such scheme is considered to be within the present scope. In some cases, for example, various sensing operations of Vdms and/or Vdmr can be performed before, during, or after receiving the write data. In one example, the circuitry is configured to receive at least a portion of the write data before applying Vdms and Vdmr, while in other examples the circuitry is configured to receive all of the write data or none of the write data before applying Vdms and Vdmr. In various examples the circuitry is configured to apply the Vdms to set bit-mapped PCM cells, the Vdms to only the set bit-mapped PCM cells, the Vdmr to the reset bit-mapped PCM cells, the Vdmr to only the reset bit-mapped PCM cells, and the like. In some examples, the circuitry is configured to apply Vdmr and Vdms such that at least a portion of PCM cells in the array receive both Vdmr and Vdms.

In another example, the circuitry is configured to apply one of Vdmr or Vdms before receiving the write data and to apply the other after receiving at least a portion of the write data.

Figure 6:
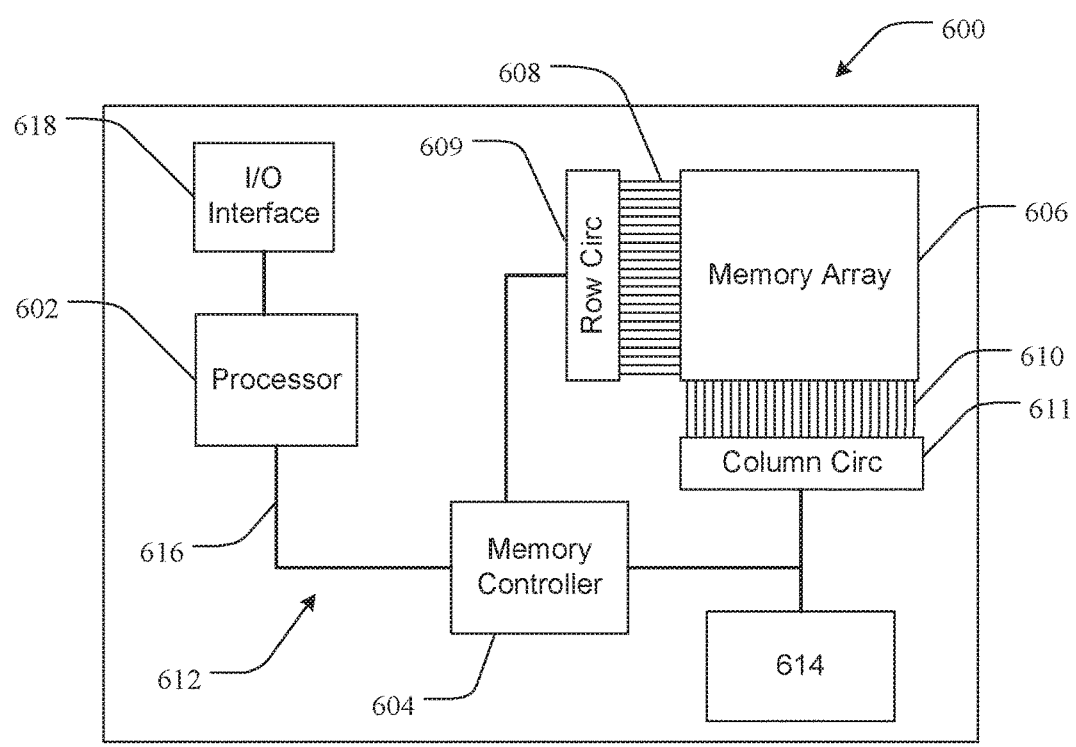
FIG. 6 is a schematic view of a phase change memory system.

In another embodiment, as is shown in FIG. 6, a computing system is provided. Such a system 600 can include a processor 602, a memory controller 604 coupled to the processor 602, and a memory array 606 of PCM cells. Each PCM cell 204, as is shown in FIG. 2b, can comprise a SD 210 and a PM 212 having a program state and coupled to the SD. The system further comprises a plurality of metallization word lines 608 coupled to groups of PCM cells across the memory array 606 and to the memory controller 604, and a plurality of metallization bit lines 610 coupled to groups of PCM cells across the memory array 606 and to the memory controller 604. Each PCM cell 204 is thus uniquely addressed in the memory array 606 by a combination of WLs 608 and BLs 610. Row circuitry 609 and column circuitry 611 can be coupled to the WLs 608 and the BLs 611, respectively. The system also comprises circuitry 612 coupled to the memory array 606, which can be configured to accomplish a variety of tasks, depending on the design of the system. Additionally, it is understood that the description of "the circuitry" can include reference to structures, tasks, processes, etc., that may be elements or functions performed by elements also recited separately in the system, such as the processor, the memory controller, and the like. As such, it is not necessarily intended that a specific distinction be drawn between the circuitry and such elements or functionality.

As one example, circuitry can be configured to select a PCM cell and apply Vdmr or Vdms across the SD and the PM of the PCM cell in order to determine the current data bit status of the PCM cell. In such cases, the memory controller would be included in the term "circuitry" at least due to the role of the controller in selecting a PCM cell. Furthermore, in some embodiments, the memory controller can be integrated into the processor as an integrated controller, and thus the processor may also be considered to be a component of the circuitry.

Regarding the system as a whole, while any type or configuration of device or computing system is contemplated to be within the present scope, non-limiting examples can include laptop computers, CPU systems, SoC systems, server systems, networking systems, storage systems, high capacity memory systems, or any other computational system that can benefit from PCM memory.

Returning to FIG. 6, the system 600 can also include additional memory 614 that can include any device, combination of devices, circuitry, and the like that is capable of storing, accessing, organizing and/or retrieving data. Non-limiting examples include SANs (Storage Area Network), cloud storage networks, volatile or non-volatile RAM, another PCM array, optical media, hard-drive type media, and the like, including combinations thereof. The system can additionally include a local communication interface 616 for connectivity between the various components of the system. For example, the local communication interface 616 can be a local data bus and/or any related address or control busses as may be desired.

The system can also include an I/O (input/output) interface 618 for controlling the I/O functions of the system, as well as for I/O connectivity to devices outside of the system. A network interface can also be included for network connectivity, either as a separate interface or as part of the I/O interface 618. The network interface can control network communications both within the system and outside of the system. The network interface can include a wired interface, a wireless interface, a Bluetooth interface, optical interface, and the like, including appropriate combinations thereof. Furthermore, the system can additionally include a user interface, a display device, as well as various other components that would be beneficial for such a system.

The processor 602 can be a single or multiple processors, and the memory array 606 and the additional memory 614 can be a single or multiple memories. The local communication interface 616 can be used as a pathway to facilitate communication between any of a single processor, multiple processors, a single memory, multiple memories, the various interfaces, and the like, in any useful combination.

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

Reference to memory devices can refer to a volatile memory device, whose state (and therefore the data stored on it) is indeterminate if power is interrupted to the device, and/or nonvolatile memory device, whose state is determinate even if power is interrupted to the device (for example, the present PCM cell array). In one embodiment, volatile memory includes one or more of DRAM (dynamic random access memory), or some variant such as synchronous DRAM (SDRAM). In one embodiment, the nonvolatile memory device is a block addressable memory device, such as NAND or NOR technologies. Thus, a memory device can also include a future generation nonvolatile devices, such as a three dimensional crosspoint memory device, other byte addressable nonvolatile memory device, or memory devices that use chalcogenide phase change material (e.g., chalcogenide glass). In one embodiment, the memory device can be or include multi-threshold level NAND flash memory, NOR flash memory, single or multi-level PCM, a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

The following examples pertain to specific embodiments and point out specific features, elements, or steps that can be used or otherwise combined in achieving such embodiments.

EXAMPLES

The following examples pertain to specific embodiments and point out specific features, elements, or steps that can be used or otherwise combined in achieving such embodiments.

In one example there is provided, a memory device, comprising:

an array of memory cells; and circuitry configured to:

identify an array location to write data comprising set bits and reset bits;

map the set bits and the reset bits of the data to corresponding cells of the array location;

apply a set demarcation bias (Vdms) to set bit-mapped cells and detect the presence or absence of a resulting snapback current;

apply a reset demarcation bias (Vdmr) to reset bit-mapped cells and detect the presence or absence of a resulting snapback current, wherein Vdmr has a higher voltage than Vdms;

apply a set pulse to snapback-negative set bit-mapped cells; and apply a reset pulse to snapback-positive reset bit-mapped cells.

In one example of a memory device, the circuitry is further configured to:

inhibit application of the set pulse to snapback-positive set bit-mapped memory cells; and inhibit application of the reset pulse to snapback-negative reset bit-mapped memory cells.

In one example of a memory device, the circuitry is further configured to receive the data comprising the set bits and the reset bits.

In one example of a memory device, the circuitry is further configured to receive at least a portion of the data before application of Vdms and Vdmr.

In one example of a memory device, the circuitry is further configured to apply the Vdms to the set bit-mapped cells.

In one example of a memory device, the circuitry is further configured to apply the Vdms to only the set bit-mapped cells.

In one example of a memory device, the circuitry is further configured to apply the Vdmr to the reset bit-mapped cells.

In one example of a memory device, the circuitry is further configured to apply the Vdmr to only the reset bit-mapped cells.

In one example of a memory device, the circuitry is further configured to receive all of the data before applying Vdms and Vdmr.

In one example of a memory device, the circuitry is further configured to apply one of Vdmr or Vdms before receipt of the data and to apply the other after receipt of at least a portion of the data.

In one example of a memory device, the circuitry is further configured to apply Vdms before receipt of the data and to apply Vdmr after receipt of at least a portion of the data.

In one example of a memory device, the circuitry is further configured to apply Vdmr and Vdms such that at least a portion of the memory cells in the array location receive both Vdmr and Vdms.

In one example of a memory device, the circuitry is further configured to create a lookup table comprising a write instruction for each memory cell in the array location.

In one example of a memory device, the circuitry is further configured to apply Vdmr and Vdms before receipt of the data.

In one example of a memory device, the array of memory cells comprises one or more of: byte addressable memory, memory devices that use chalcogenide phase change material, multi-threshold level NAND flash memory, NOR flash memory, single or multi-level PCM, a resistive memory, nanowire memory, ferroelectric transistor random access memory (FeTRAM), magnetoresistive random access memory (MRAM) memory that incorporates memristor technology, or spin transfer torque (STT)-MRAM.

In one example there is provided, a memory system, comprising:

a device as recited herein, wherein each cell further comprises:

a phase change material; and a select device material coupled to the phase change material;

a plurality of metallization word lines coupled to groups of cells across the array;

a plurality of metallization bit lines coupled to groups of cells across the array, such that each cell is uniquely addressed in the array by a combination of a word line and a bit line; and wherein the circuitry is further configured to:

generate memory control commands;

address the cells in the array; and read a state of each cell.

In one example of a memory system, the plurality of word lines is coupled to the phase change materials of the cells and the plurality of bit lines is coupled to the select device materials of the cells.

In one example of a memory system, the plurality of bit lines is coupled to the phase change materials of the cells and the plurality of word lines is coupled to the select device materials of the cells.

In one example of a memory system, the select device material comprises an ovonic threshold switch or a semiconductor diode.

In one example of a memory system, the system further comprises a power source coupled to the circuitry and to the memory array.

In one example of a memory system, the memory array comprises a two or three dimensional array.

In one example of a memory system, the circuitry further comprises I/O circuitry configured to control I/O operations of the system.

In one example of a memory system, the circuitry further comprises:

row circuitry coupled to the word lines of the memory array; and column circuitry coupled to bit lines of the memory array, the column circuitry and the row circuitry being configured to address the plurality of memory cells of the memory array.

In one example of a memory system, the circuitry further comprises read/write circuitry coupled to the row circuitry and the column circuitry and configured to control read and write commands to and from the memory array.

In one example of a memory system, the system further comprises one or more of:

at least one processor communicatively coupled to the system;

a display communicatively coupled to the system;

a battery coupled to the system; or a network interface communicatively coupled to the system.

In one example there is provided, a method for controlling a memory, the method comprising:

identifying an array location in a memory cell array to write data comprising set bits and reset bits;

mapping the set bits and the reset bits of the data to corresponding memory cells of the array location;

applying set demarcation biases (Vdms) to set bit-mapped memory cells and detecting the presence or absence of a resulting snapback current;

applying reset demarcation biases (Vdmr) to reset bit-mapped memory cells and detecting the presence or absence of a resulting snapback current, wherein Vdmr has a higher voltage than Vdms;

applying set pulses to snapback-negative set bit-mapped memory cells; and applying reset pulses to snapback-positive reset bit-mapped memory cells.

In one example of a method, the method further comprises:

inhibiting applying the set pulses to snapback-positive set bit-mapped memory cells; and inhibiting applying the reset pulses to snapback-negative reset bit-mapped memory cells.

In one example of a method, the method further comprises receiving the data comprising the set bits and the reset bits.

In one example of a method, the method further comprises receiving at least a portion of the data before applying Vdms and Vdmr.

In one example of a method, the method further comprises receiving all of the data before applying Vdms and Vdmr.

In one example of a method, the method further comprises applying one of Vdmr or Vdms before receiving the data and applying the other after receiving the data.

In one example of a method, the method further comprises applying Vdms before receiving the data and applying Vdmr after receiving the data.

In one example of a method, the method further comprises applying Vdmr and Vdms to the same cell for at least a portion of the memory cells in the array.

In one example of a method, the method further comprises creating a lookup table comprising a write instruction for each memory cell in the array location.

In one example of a method, the method further comprises applying Vdmr and Vdms before receiving the data.

In one example of a method, the memory cell array comprises one or more of: byte addressable memory, memory devices that use chalcogenide phase change material, multi-threshold level NAND flash memory, NOR flash memory, single or multi-level PCM, a resistive memory, nanowire memory, ferroelectric transistor random access memory (FeTRAM), magnetoresistive random access memory (MRAM) memory that incorporates memristor technology, or spin transfer torque (STT)-MRAM.

While the forgoing examples are illustrative of the principles of disclosed embodiments in one or more particular applications, it will be apparent to those of ordinary skill in the art that numerous modifications in form, usage and details of implementation can be made without the exercise of inventive faculty, and without departing from the principles and concepts of the disclosure.

What is claimed is:

1. A memory device, comprising:
an array of memory cells; and
circuitry configured to:
apply a set demarcation bias voltage (Vdms) to a plurality of cells and detect the presence or absence of a resulting transient snapback current;
after applying the set demarcation bias voltage (Vdms) to the plurality of cells, receive at least a portion of data comprising set bits and reset bits;
identify an array location to write data comprising set bits and reset bits;
map the set bits and the reset bits of the data to corresponding cells of the array location;
apply a reset demarcation bias voltage (Vdmr) to reset bit-mapped cells and detect the presence or absence of a resulting transient snapback current, wherein Vdmr has a higher voltage than Vdms;
apply a set pulse to set bit-mapped cells in which the transient snapback current is absent; and
apply a reset pulse to reset bit-mapped cells in which the transient snapback current is present.

2. The device of claim 1, wherein the circuitry is further configured to:
after applying the set pulse to set bit-mapped cells in which the transient snapback current is absent, inhibit further application of the set pulse to snapback-positive set bit-mapped memory cells; and
after applying the reset pulse to reset bit-mapped cells in which the transient snapback current is present, inhibit further application of the reset pulse to snapback-negative reset bit-mapped memory cells.

3. The device of claim 1, wherein the circuitry is further configured to receive the portion of the data after application of Vdms and before application of Vdmr.

4. The device of claim 3, wherein the circuitry is further configured to apply the Vdms prior to determining the set bit-mapped cells.

5. The device of claim 3, wherein the circuitry is further configured to apply the Vdms prior to determining the reset bit-mapped cells.

6. The device of claim 3, wherein the circuitry is further configured to apply the Vdmr to the reset bit-mapped cells.

7. The device of claim 3, wherein the circuitry is further configured to apply the Vdmr to only the reset bit-mapped cells.

8. The device of claim 1, wherein the circuitry is further configured to apply Vdmr after receipt of the portion of the data and to apply Vdms before receipt of the portion of the data.

9. The device of claim 1, wherein the circuitry is further configured to apply Vdms such that at least a portion of the memory cells in the array location receive Vdms.

10. The device of claim 1, wherein the array of memory cells comprises one or more of: byte addressable memory, memory devices that use chalcogenide phase change material, multi-threshold level NAND flash memory, NOR flash memory, single or multi-level PCM, a resistive memory, nanowire memory, ferroelectric transistor random access memory (FeTRAM), magnetoresistive random access memory (MRAM) memory that incorporates memristor technology, or spin transfer torque (STT)-MRAM.

11. A method for controlling a memory, the method comprising:
   applying set demarcation bias voltages (Vdms) to a plurality of memory cells and detecting the presence or absence of a resulting transient snapback current;
   after applying the set demarcation bias voltage (Vdms) to the plurality of memory cells, receiving at least a portion of data comprising set bits and reset bits;
   identifying an array location to write data comprising set bits and reset bits;
   mapping the set bits and the reset bits of the data to corresponding cells of the array location;
   applying reset demarcation bias voltages (Vdmr) to reset bit-mapped memory cells and detecting the presence or absence of a resulting transient snapback current, wherein Vdmr has a higher voltage than Vdms;
   applying set pulses to set bit-mapped memory cells in which the transient snapback current is absent; and
   applying reset pulses to reset bit-mapped memory cells in which the transient snapback current is present.

12. The method of claim 11, further comprising:
   after applying the set pulses to the set bit-mapped memory cells in which the transient snapback current is absent, inhibiting further application of the set pulses to snapback-positive set bit-mapped memory cells; and
   after applying the reset pulses to the reset bit-mapped memory cells in which snapback current is present, inhibiting further application of the reset pulses to snapback-negative reset bit-mapped memory cells.

13. The method of claim 11, further comprising applying Vdmr after receipt of the data and to apply Vdms before receipt of at least a portion of the data.

14. The method of claim 11, wherein the memory cell array comprises one or more of: byte addressable memory, memory devices that use chalcogenide phase change material, multi-threshold level NAND flash memory, NOR flash memory, single or multi-level PCM, a resistive memory, nanowire memory, ferroelectric transistor random access memory (FeTRAM), magnetoresistive random access memory (MRAM) memory that incorporates memristor technology, or spin transfer torque (STT)-MRAM.

* * * * *